United States Patent [19]

Sakamoto

[11] 3,818,353

[45] June 18, 1974

[54] AUTOMATIC TUNING APPARATUS HAVING DUAL FREQUENCY SWEEP

[75] Inventor: Yoichi Sakamoto, Yoyonaka, Japan

[73] Assignee: Matsushita Electric Industrial Co., Ltd., Kadoma City, Osaka Prefecture, Japan

[22] Filed: May 8, 1972

[21] Appl. No.: 251,269

[30] Foreign Application Priority Data

| | | |
|---|---|---|
| May 8, 1971 | Japan | 46-30636 |
| May 8, 1971 | Japan | 46-30637 |
| May 8, 1971 | Japan | 46-30638 |
| May 8, 1971 | Japan | 46-30639 |
| May 8, 1971 | Japan | 46-30640 |

[52] U.S. Cl. .................. 325/470, 325/422, 325/423, 325/457

[51] Int. Cl. .............................................. H04b 1/32

[58] Field of Search ............................ 325/468–470, 325/459, 457, 417, 418, 422, 423, 334, 335, 419; 334/15, 18

[56] References Cited

UNITED STATES PATENTS 3,611,152 10/1970 Sakai ................................ 325/469

*Primary Examiner*—Albert J. Mayer
*Attorney, Agent, or Firm*—Craig & Antonelli

[57] ABSTRACT

In an automatic tuning apparatus having a local oscillator which comprise varactors (i.e., variable capacitance diodes) as responsance capacitors, the local oscillator is capable of sweeping its frequency from a preliminary frequency over a specified sweep range exceeding the proper frequency for tuning in a broadcast signal of a channel. When a broadcast signal is present in that channel, the sweep is terminated at the proper freuqncy, so as to tune in and receive the signal; however, when no signal is present in the channel, the sweep continues until it has been detected that the sweep has traversed the specified sweeping range, passing the proper frequency.

36 Claims, 7 Drawing Figures

AUTOMATIC TUNING APPARATUS HAVING DUAL FREQUENCY SWEEP

BACKGROUND OF THE INVENTION

This invention relates to an automatic tuning apparatus having at least a frequency sweeping means, the frequency of which is swept from one frequency to another frequency and is stopped at the frequency for tuning in a broadcast signal of a selected channel.

More particularly this invention concerns an automatic tuning apparatus having at least one tuning circuit which sweepingly changes its tuning frequency so as to tune in a broadcast signal, wherein a detection signal is generated in the apparatus when the tuning frequency of the tuning circuit has swept over a specified frequency difference, and the detection signal causes the sweep to stop.

Hitherto, an automatic tuning apparatus which utilizes varactors (i.e., variable capacitance diodes) as tuning elements or resonance element has been conventionally used. In such an apparatus, sweepingly (i.e., continuously) and linearly changing voltages (i.e., sweep voltages) have been applied to the varactors and, thereby, tuning frequencies of the tuning circuits have been sweepingly changed (i.e., swept). Then, upon tuning in a broadcast signal, an intermediate frequency (hereinafter referred to as IF) signal is generated and, by detecting the IF signal, the sweeping of the tuning frequency is stopped and retained thereafter.

In case such an automatic tuning apparatus is used in a television receiver and if a broadcast signal is interrupted, the tuner which has hitherto tuned in the signal detunes (i.e., goes off tuning) from the signal frequency. Such detuning may cause an undesirable false tuning-in of a sound-carrier frequency by a video-signal tuner, or erroneous operation of a channel-number indicating means.

SUMMARY OF THE INVENTION

This invention purports to provide an improved automatic tuning apparatus capable of stably retaining a tuned frequency, without detuning even at or after an interruption of the input signal to be tuned in, without false tuning in the sound-carrier frequency by a video-signal tuner, or without causing a false operation of the channel-number indicator at or after the interruption of the input signal.

DETAILED EXPLANATION OF THE INVENTION

GENERAL CONFIGURATION

Figure 1:
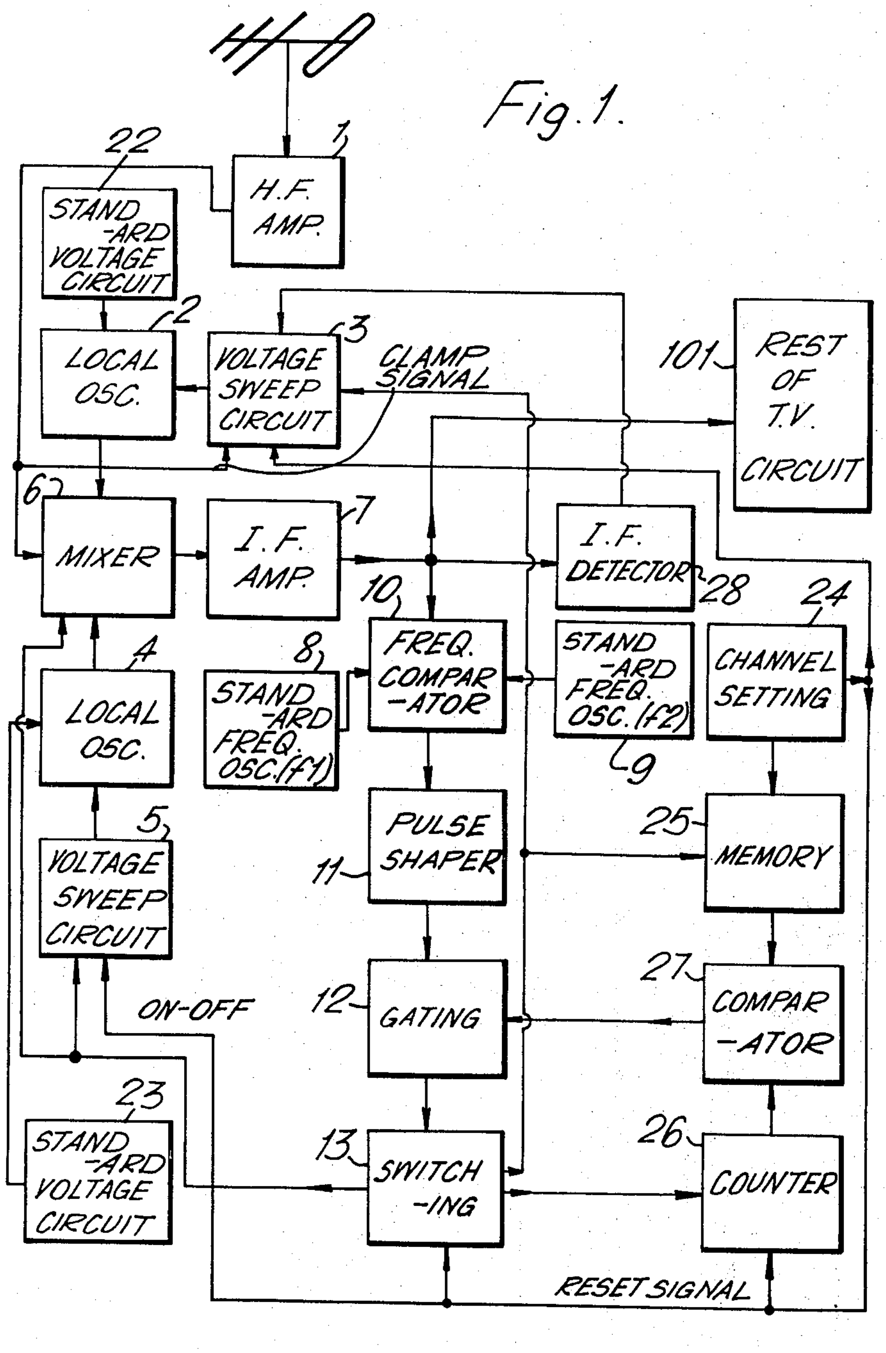
FIG. 1 is a block diagram showing the general constitution of the automatic tuning apparatus of the present invention.

In FIG. 1, which shows a general configuration of the automatic tuning apparatus of the present invention, high frequency amplifier 1 is so connected to an antenna and provides its output to a mixer 6. A pair of local oscillators 2 and 4 containing varactors in their tuning circuits, respectively, are connected to the mixer 6 so as to feed their oscillation outputs to the mixer 6. A first voltage sweep circuit 3 is connected to the first local oscillator 2 so as to supply a sweepingly changing voltage to the varactor in the first local oscillator 2 to make the first local oscillator 2 sweep its oscillation frequency, a second voltage-sweep circuit 5 is connected to the second local oscillator 4 to provide a sweepingly changing voltage to the varactor in the second local oscillator 4 and to cause the second oscillator 4 sweep its oscillation frequency.

The first local oscillator 2 and the first voltage sweep circuit 3 constitute a first frequency sweeping means, and the second local oscillator 4 and the second voltage sweep circuit 5 constitute a second frequency sweeping means.

The mixer 6 is constituted to produce an intermediate frequency (i.e., IF) signal by mixing the outputs of HF amplifier 1 and the first local oscillator 2 and to provide a "difference-of-frequencies" signal by mixing the outputs of the first local oscillator 2 and the second local oscillator 4. The production of the IF signal and the "difference-of-frequencies" signal in the mixer 6 is alternately switched with a control signal coming from the switching circuit 13. An IF amplifier 7 is connected to the mixer 6 so as to receive outputs of the mixer 6.

A frequency comparator 10 receives the amplified output signal of the IF amplifier 7. A first standard frequency oscillator 8 and a second standard frequency oscillator 9 are connected to the frequency comparator 10 to supply oscillation output signals at frequencies *f*1 and *f*2, respectively, to the comparator. The comparator 10 supplies a pulse signal to a pulse shaper 11 connected thereto. A gating circuit 12 receives the output signal of the pulse shaper 11 and supplies a signal to the switching circuit 13 when a signal is received simultaneously from a comparator 27. Also, the output terminals of the switching circuit 13 are connected to the first and the second voltage-sweep circuits 3 and 5 so as to initiate their sweep. Another terminal of the switching circuit 13 is connected to the mixer 6 whereby the outputs of the local oscillators 3 and 5 are mixed when the output of the switching circuit 13 is provided and the outputs of the HF amplifier 1 and the first local oscillator 3 are mixed when the output of the circuit 13 is not supplied.

Figure 2:
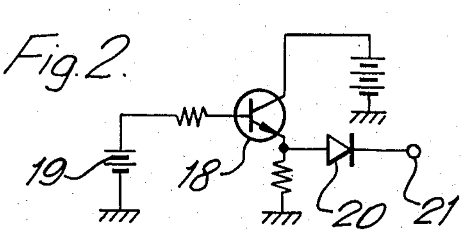
FIG. 2 is a circuit diagram showing a practical network of a standard-voltage supply circuit of the apparatus.

A first standard voltage source or circuit 22 and a second standard voltage source or circuit 23 are connected to the first and second local oscillators 2 and 4 respectively, so as to supply standard voltages to these local oscillators, respectively. One example of standard voltage circuits is shown in FIG. 2, wherein a standard voltage cell 19 is connected to the base of a transistor 18 which is connected to an emitter-follower circuit, and the emitter of the transistor 18 is connected to the output terminal 21 through a diode 20. Such standard voltage circuits 22 and 23 supply precise standard voltages which are regulated by the standard voltage cell 19, with very low output impedances. By receiving these standard voltages, the lowest oscillation frequencies of the first and the second local oscillators 2 and 4 are controlled to be specified frequencies, respectively. These specified frequencies or lowest frequencies of the first and the second local oscillators 2 and 4 are defined as a first basic preliminary frequency $f(s1)$ and a second basic preliminary frequency $f(s2)$, respectively. An IF detector 28 is connected to IF amplifier 7 so as to receive the IF signal. Numeral 101 indicates the rest of the television circuit which is connected to the IF amplifier 7. A channel setting circuit 24 provides its setting output to a memory circuit 25 and provides resetting signal to voltage sweep circuits 3 and 5, switching circuit 13 and counter 26. A comparator 27 receives the output signals of the memory circuit 25 and the counter 26, respectively, and supplies its output signal to gating circuit 12. The counter 26 receives the signal from the switching circuit 13, so that number of times the switching circuit 13 is switched is counted in the counter 26.

Figure 3:
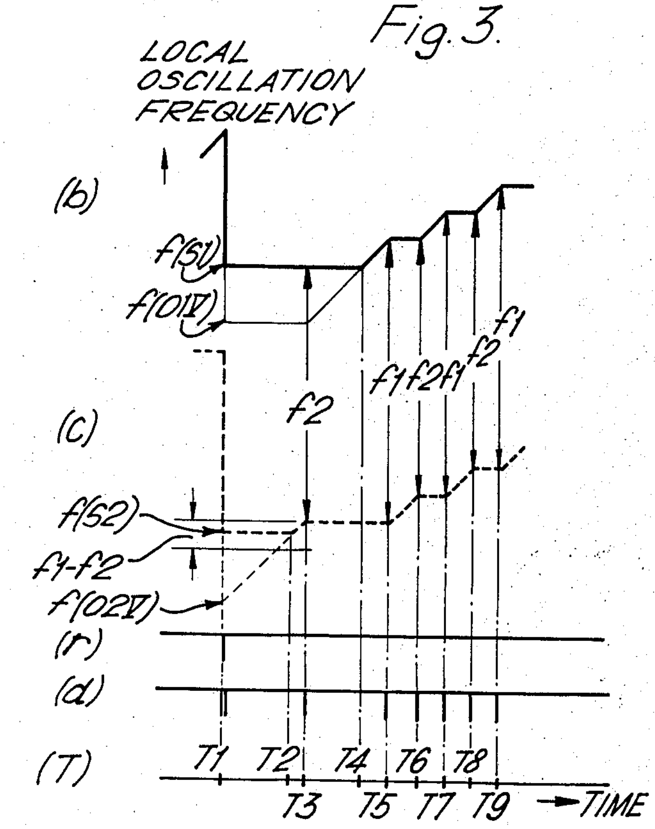
FIG. 3 is a time chart illustrating the operation of the apparatus.

Operation of the above-mentioned apparatus is explained hereafter referring to FIG. 3, wherein solid line stepwise curve ($b$) represents the oscillation frequency of the first local oscillator 2 and broken line curve ($c$) represents the oscillation frequency of the second local oscillator 4, both just after the resetting of the apparatus. The frequency differences $f1$ and $f2$ between the curves ($b$) and ($c$) represent the above-mentioned frequency differences, or "differences of frequencies". Also, curve ($r$) indicates a reset signal, curve ($d$) indicates the output of the IF detector 28, and the abscissa (T) indicates time.

At the time T1, reset signals are applied to the first voltage sweep circuit 3, to the second voltage sweep circuit 5 and to the switching circuit 13 from the channel setting circuit 24.

On account of the standard voltages applied from the standard voltage circuits 22 and 23 to the local oscillators 2 and 4, respectively, at the time T1 of receiving the reset signals, the oscillation frequencies of the first and the second local oscillators 2 and 4 are set to be the first basic preliminary frequency $f(s1)$ and the second basic preliminary frequency $f(s2)$, respectively. If the standard voltage circuits 22 and 23 are not provided, due to the decrease to zero of the outputs of the voltage sweep circuits 3 and 5 at the time T1 of resetting, the oscillation frequencies of the local oscillators 2 and 4 will be far lower thas shown by $f(01V)$ and $f(02V)$, respectively.

After a certain lapse of time from the above-mentioned resetting, the sweepingly increasing output voltage of the second voltage sweep circuit 5 exceeds the output voltage of the second standard voltage circuit 23 at a time T2, and the oscillation frequency of the second local oscillator 4 starts to sweep upwards according to the increase of the voltage of the second voltage sweep circuit 5.

At this stage the first voltage sweep circuit 3 still remains at the lowest voltage. Then, at the time T3 when the "frequency difference" between the oscillation frequencies of the first and the second local oscillators 2 and 4 reaches the frequency $f2$ of the second standard frequency oscillator 9, the frequency of the signal sent out from the mixer 6 to the IF amplifier 7 becomes $f2$, and the frequency comparator 10 detects that the aforementioned "frequency difference" now agrees with the oscillation frequency $f2$ of the second standard frequency oscillator 9. Upon the detection of this frequency coincidence, the pulse shaper 11 receives an output pulse from the comparator 10 and supplies a shaped pulse to the switching circuit 13 through the gating circuit 12. Upon receiving the pulse, the switching circuit 13 supplies its output to the first and the second voltage sweep circuits 3 and 5, in order to stop the sweep of the second voltage sweep circuit 5 and, simultaneously, to start the sweep of the first voltage sweeping circuit 3. Accordingly, at the time T3, the second local oscillator 4 stops the sweep of its oscillation frequency.

However, at the time T3, the first local oscillator 2 has not yet started to sweep its oscillation frequency, since the first standard voltage has been applied from the first standard voltage circuit 22 to the first local oscillator 2. Thus, it takes a certain time interval, i.e., from the time T3 to the time T4, until the frequency of the first frequency oscillator 2 starts to sweep at the time T4.

Then, the second local frequency oscillator 4 sweeps its oscillation frequency, and at the time T5, the frequency difference between the oscillation frequencies of the first and the second local oscillators 2 and 4 reaches the frequency $f1$ of the first standard frequency oscillator 8, and the frequency of the signal from the mixer 6 becomes the frequency $f2$. Therefore, the frequency comparator 10 detects that the aforementioned frequency difference now coincides with the oscillation frequency $f2$ of the second standard frequency oscillator 9. Upon detection of this frequency coincidence, the pulse shaper 11 receives the output pulse from the comparator 10 and delivers a shaped pulse to the switching circuit 13 through the gating circuit 12 and, therefore, the switching circuit 13 supplies an output to the first and the second voltage sweep circuits 3 and 5. Accordingly at the time T5, the first local oscillator 2 terminates its sweep of its oscillation frequency and the second local oscillator 4 restarts its sweep its oscillation frequency.

Hereafter, the first and the second local oscillators 2 and 4 simultaneously invert their alternate stop-and-start sweeps. Namely, as shown in FIG. 3, the first and the second local oscillators 2 and 4 alternately and in a stepwise manner sweep their frequencies.

The frequency difference between the first standard frequency $f1$ and the second standard frequency $f2$ is set to be one half of the frequency differences between the video carrier frequencies of the neighboring channels. The oscillation frequencies of the first and the second local oscillators 2 and 4 alternately and stepwise sweep and stop, respectively, as shown in FIG. 3. The first basic preliminary frequency $f(s1)$ is set to be a preliminary frequency of the lowest channel. The preliminary frequency is defined as the frequency that is prior in the sweep to the proper frequency, which is proper for tuning in a channel, to the extent of a specified small frequency difference. Accordingly, the oscillation frequencies of the first local oscillator 2 at every 2nd stoppage of its sweep provides preliminary oscillation frequencies for every channel.

If the frequency difference between the first standard frequency f1 and the second standard frequency $f2$ is selected to be one $n$-th of the frequency difference between the video carrier frequencies of the neighboring channels, the oscillation frequency of the first local oscillator 2 at every $n$-th stoppage of its sweep gives preliminary oscillation frequencies for every channel. Accordingly, by counting the number of times alternation of the sweeping and the stoppage of the local oscillators 2 and 4 occurs. It is possible to stop the alternate and stepwise sweeping of the local oscillation frequencies at a selected preliminary frequency for receiving a selected channel.

The afore-mentioned process is explained in more detail in the following.

At first, by manipulating the channel selector (not shown in the drawing) of the channel setting circuit 24 a desired channel is selected, and its digital output which corresponds to the channel number is memorized in the memory circuit 25. The counter 26 counts the number of outputs of the switching circuit 13. The comparator 27 compares the numbers in the memory circuit 25 and in the counter 26, and delivers a pulse signal to the gating circuit 12 when the numbers of the memory circuit 25 and the counter 26 coincide, thereby causing the gating circuit 12 to be turned "off". The gating circuit 12 is "on", absent coincidence of the numbers of the memory circuit 25 and the counter 26. Due to the "off" stage of the gating circuit 12, transmission of the output signal of the pulse shaper 11 is terminated. The counter 26 is constituted so as to increase its contents by one for every two output pulses of the switching circuit 13 which generates one output pulse for each pulse of the frequency comparator 10. Therefore, the number in the counter 26 increases by one for each pair of alternate sweeps of the respective local oscillators 4 and 5. Accordingly, the switching circuit 13 supplies output signals to the voltage sweep circuits 3 and 5 and causes them to sweep their output voltages alternately in a stepwise manner until the sequence of stepwise sweeps of the first local oscillator 2 is stopped at the preliminary frequency of a selected channel.

Next, one example of the voltage sweep circuit usable as the circuit 3 will be explained referring to FIG. 4 which is a circuit diagram and to FIG. 5 which is a time chart showing voltages of various parts of FIG. 4.

Figure 4:
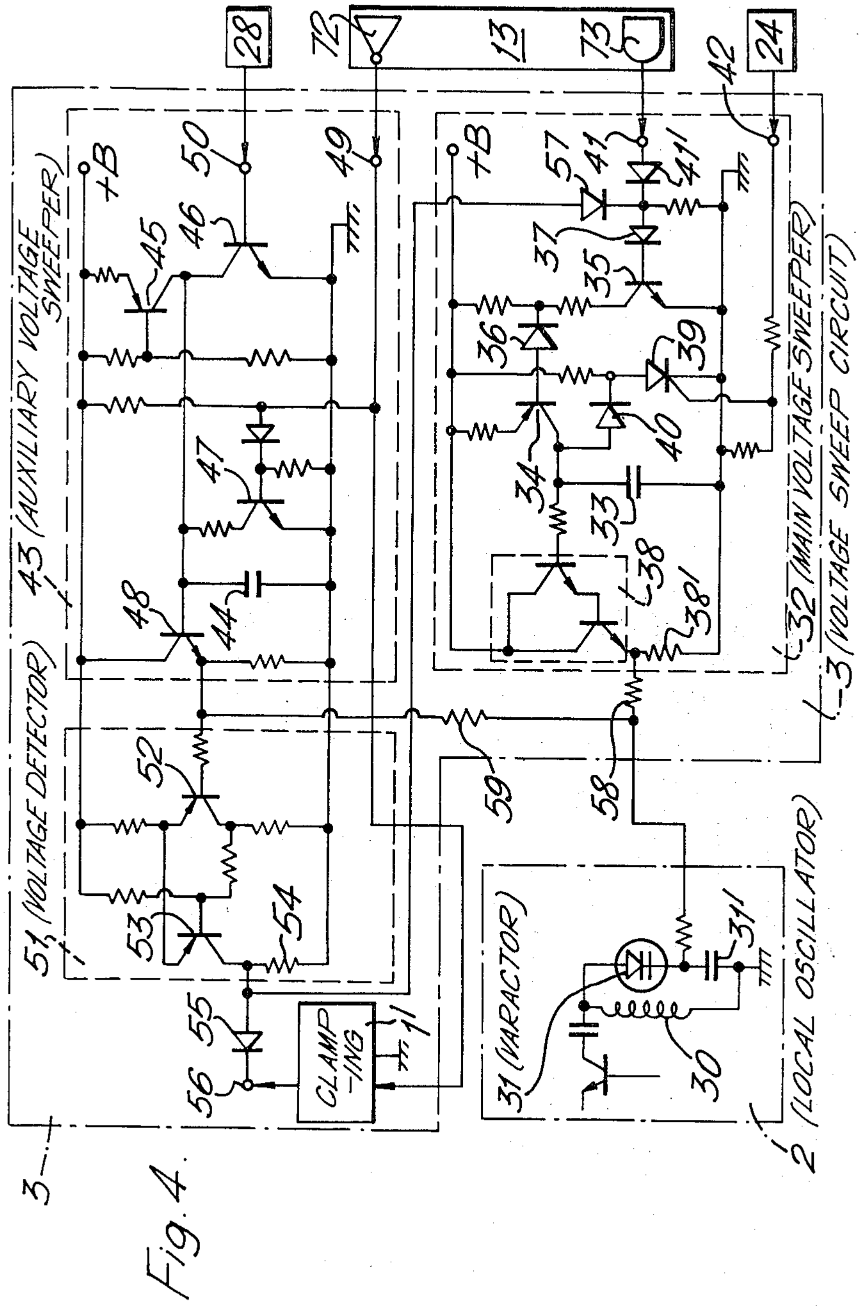
FIG. 4 is a circuit diagram showing a practical example of a voltage-sweep circuit and a local oscillator, both of which are contained in the apparatus.

As shown in FIG. 4, the voltage sweep circuit 3 comprises a main voltage sweeper 32, an auxiliary voltage sweeper 43, a voltage detector 51 and a clamping circuit 1'.

The local oscillator 2 comprises a resonance circuit consisting of a coil 30 and a varactor 31 as the resonance capacitor. The capacitor 31' is for blocking D.C. current.

The main voltage sweeper 32 comprises a charge-discharge capacitor 33, a transistor 34 for controlling charging of the capacitor 33, a switching transistor 35 for controlling the on-off state of the transistor 34, a level-shift diode 36, a Darlington circuit 38 which receives the voltage of the capacitor 33 with a high input impedance and delivers an output voltage with a low output impedance, and a series connection of a diode 40 and a thyristor 39 connected across the both ends of the capacitor 33. A level-shift diode 37 is connected to the input terminal, i.e., the base of the switching transistor 35. Didoes 41' and 57 are for prevention of interference between the signal at sweep control input terminal 41 and the signal from the voltage detector 51. The thyristor 39 is for discharging the charge of the capacitance 33 when a reset signal is applied to a reset terminal 42, and the diode 40 is for completely blocking the discharging current when the thyristor 40 is off.

The auxiliary voltage sweeper 43 comprises a charge-discharge capacitor 44, a transistor 45 for controlling charging of the capacitor a discharge-controlling transistor 46, whose collector and emitter are connected to both ends of the capacitor 44, respectively, and whose base is connected to a feedback signal input terminal 50, a short circuiting transistor 47 whose collector and emitter are connected to both ends of the capacitor 44, respectively, and whose base is connected to the auxiliary sweep control signal input terminal 49, and a transistor 48 of emitter-follower connection which receives the voltage of the capacitor 44 with a high input impedance and provides an output voltage with a low output impedance. The voltage detector 51 is for detecting that the output voltage of the auxiliary voltage sweeper 43 exceeds a specified voltage, so that when the output voltage exceeds the specified voltage, a control signal is delivered to the base of the transistor 35 of the main voltage sweeper 32. The voltage detector 51 is constituted as a Schmitt-trigger circuit consisting of a pair of transistor 52 and 53. The output terminal of the voltage detector 51 is connected to the clamp signal input terminal 56 through a diode 55, to which terminal a clamping circuit 1' is connected. The output voltage at the output terminal of the main voltage sweeper 32 and the output voltage at the terminal of the auxiliary voltage sweeper 43 are added or superimposed on each other through a resistor 58 and a resistor 59, respectively, and the added output is supplied to the varactor 31 of the local oscillator.

The feedback signal input terminal 50 is connected to the IF detector 28 so as to receive a feedback signal. The auxiliary sweep control input terminal 49 is connected to the switching circuit 13 so as to receive the signal for controlling the auxiliary sweeping. The input terminal of the clamping circuit 1' is also connected to the switching circuit 13 so as to receive a control signal. The base of the switching transistor 35 is connected also to the switching circuit 13 through the diodes 37 and 41' so as to receive the signal to control the transistor 35. The triggering terminal 42 to which control electrode of the thyristor 39 is connected, is connected to the channel setting circuit 24 so as to receive a reset signal.

In the above-mentioned voltage sweep circuit 3, the main voltage sweeper 32 and the local oscillator 2 together constitute a main frequency sweeping means, and the auxiliary voltage sweeper 43 and the local oscillator 2 together constitute an auxiliary frequency sweeping means.

Figure 5:
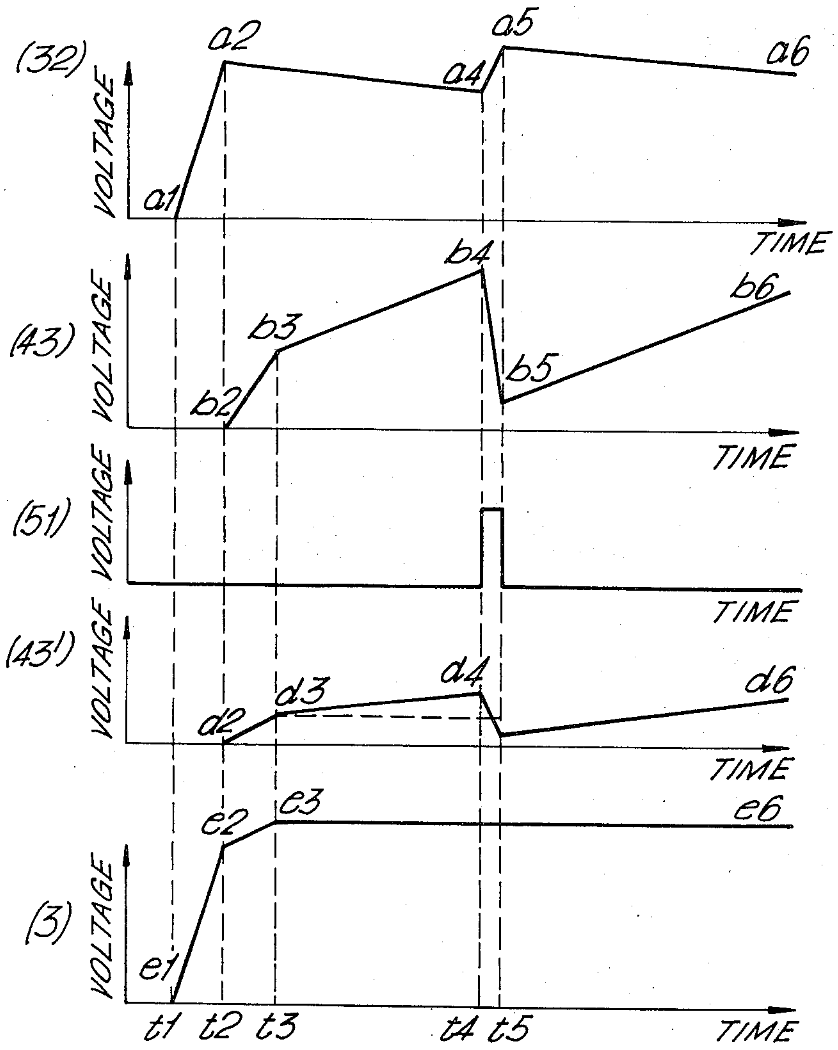
FIG. 5 is a time chart showing curves of voltages at various parts of the apparatus.

Operation of the above-mentioned voltage sweep circuit 3 is explained hereunder referring to FIG. 5, where in curve (32) indicates the output voltage of the main voltage sweeper 32, curve (43) indicates the output voltage of the auxiliary voltage sweeper (43), curve (51) indicates the output voltage of the voltage detector 51, curve (43') indicates a divided voltage presented by dividing the output of the auxiliary voltage sweeper 43 by the resistors 59, 58 and 38', which divided voltage is to be superposed on the output of the main voltage sweeper 32, and curve (3) indicates the output of the voltage sweep circuit 3, i.e., the sweep voltage generated by superposition and applied to the varactor 31 of the local oscillator.

At first, at the time t1, by the channel selecting operation of the channel setting circuit 24, both sweepers 32 and 43 are reset and the capacitors 33 and 44 are both discharged, and, therefore, the output voltage applied to the local oscillator 2 is zero. When a positive sweep control signal is applied to the input terminal 41 at the time t1, the switching transistor 35 is turned "on" decreasing its collector voltage almost to zero. Accordingly, the charge controlling transistor 34 is turned on, commencing charge of the capacitor 33. Thus, the output of the main voltage sweeper 32 increases as shown by a segment *a*1–*a*2 of FIG. 5 (32).

When, at a time t2, the sweeping frequency of the local oscillator 2 reaches a preliminary frequency which is close to but less than the frequency which is the local oscillation frequency for tuning, namely when the output of the voltage sweep circuit 3 reaches a "preliminary voltage" which corresponds to the preliminary frequency, and hence is very close to but slightly less than the voltage which is proper for tuning, the sweep control signal which has been applied from the time *t*1 from the switching circuit 13 to the terminal 41 is controlled to be reduced to zero, turning the switching transistor 35 "off" and, hence, the charge controlling transistor "off". Accordingly, the sweeping increase of the output of the main voltage sweeper 32 stops at the time *t*2.

Upon termination of the sweep of the main voltage sweeper 32 at the time *t*2, an auxiliary sweep control signal which has been positive and is applied to the terminal 49 from the switching circuit 13 is decreased to zero and, therefore, the transistor 47 is turned "off". Accordingly, the charging of the capacitor 44 starts and the output of the auxiliary voltage sweeper 43 starts to increase as shown by the segment *b*2–*b*3 of FIG. 5 (43). The foregoing increase *b*2–*b*3 of the output of the auxiliary voltage sweeper 43 causes a slow increase in the divided voltage as shown by the segment *d*2–*d*3 of FIG. 2 (43').

Accordingly, the superposed total output voltage of the voltage sweep circuit 3 increases, as shown in FIG. 5 (3), wherein the segment *e*1–*e*2 indicates a rapid voltage sweep until reaching the "preliminary voltage", namely in the first period from *t*1 to *t*2, and the segment *e*2–*e*3 indicates a slow voltage sweep from the preliminary voltage to the proper voltage, namely in the second period from *t*2 to *t*3.

As is clear from the foregoing descriptions, the frequency of the local oscillator 2 reaches the preliminary frequency at the time *t*2, and reaches the proper frequency at the time *t*3.

Upon reaching the proper frequency, namely upon tuning, at the time *t*3, the output of the IF detector 28 applied to the feedback, signal input terminal 50 of the auxiliary voltage sweeper 43 increases and, therefore, the conduction of the transistor 46 is increased, so that charging of the capacitor 44 is stopped and, accordingly, sweeping of the auxiliary voltage sweeper 43 is stopped.

Of course, the circuit of the capacitor 33 has such voltage retaining measures as separating the capacitor 33 from the load, namely the varactor diode 31, with the large impedance input circuit as the Darlington circuit 38 and with the leakage protecting diode 40, during a long lapse of time.

However, it is inevitable that the voltage of the main voltage sweeper 32 gradually decreases as shown by the segment *a*2–*a*4 of FIG. 5 (32) over the long period of time.

Such a decrease in the main voltage sweeper 32 is compensated by a slight increase in the voltage of the auxiliary voltage sweeper 43. The increase is obtained as follows. When the output of the main voltage sweeper 32 decreases, the tuner detunes from the tuned-in signal and, therefore, the output of the IF detector 28 decreases. Accordingly, the transistor 46 decreases its collector-emitter conduction. As a result, the charging to the capacitor 44 is effected with a small current. The voltage sweep circuit 3, local oscillator 2, mixer 6, IF amplifier 7, IF detector 28 and the auxiliary voltage sweeper 43 constitute an automatic control loop and, hence, the output of the auxiliary voltage sweeper 43 is controlled to gradually increase its voltage, as shown by a segment *b*3–*b*4 of FIG. 5 (6) and the total output of the voltage sweep circuit 3 is controlled to be constant for a considerable time.

However, after a long period of time, when the output of the auxiliary voltage sweeper 43 exceeds a specified voltage at the time T4 in the voltage detector 53, the transistors 52 and 53 turn "off" and "on", respectively. Accordingly, the output pulse as shown in FIG. 5 (51) is supplied to the base of the transistor 35 of the main voltage sweeper 32. Therefore, the switching transistor 34 is turned "on" at the time T4 and causes the capacitor 33 to be charged again and causes the output of the main voltage sweeper 32 to increase as shown by the segment *a*4–*a*5 of FIG. 5 (FIG. 32), so as to restore the output voltage at the time of *t*2.

In compliance with an increase in the output voltage of the main voltage sweeper 32, the output voltage of the auxiliary voltage sweeper 43 is decreased as shown by a segment *b*4–*b*5 of FIG. 5 (43), by the function of the above-mentioned automatic control loop, so as to maintain the resultant output voltage of the main voltage sweep circuit 3 constant.

At the time T5, the states of transistors 52 and 53 of the voltage detector 51 are inverted and, accordingly, the main voltage sweeper 32 stops its sweep and the cooperating auxiliary voltage sweeper 43 stops decreasing its output voltage.

Thereafter, during the tuning-in of a broadcast signal, with the lapse of time, the above-mentioned cooperative operations of the main voltage sweeper 32 and the auxiliary voltage sweeper 43 in the voltage sweep circuit 3 are repeated, maintaining total output voltage of the voltage sweep circuit 3 constant.

Should the TV signal accidentally disappear after tuning-in and during reception of the signal, the IF detector 28 fails to supply an output to the feedback signal input terminal 50, and, therefore, the auxiliary voltage sweeper 43 starts to sweep. As a result, after a short while, the voltage detector circuit 51 is inverted. However, the clamp signal input terminal 56 receives a clamping signal, so as to ground the terminal to zero volts by the low impedance of the clamping circuit 1', controlled by the absence of the signal in the HF amplifier 1. Therefore, the clamping circuit 1' functions to prevent the voltage detector 51 from supplying the output signal generated by the inversion thereof to the main voltage sweeper 32. Accordingly, the main voltage sweeper does not start to sweep and the total output voltage of the voltage sweep circuit 3 remains constant. Then, when the TV signal is restored again and the output of the IF detector 51 is restored again, the auxiliary voltage sweeper 43 is controlled again so as to properly tune-in the signal. Accordingly, irrevocable detuning from the once-tuned in broadcast signal is prevented, even at for considerable long interruption of the signal.

The other voltage sweep circuit 5 shown in FIG. 1 includes only a main voltage sweeper which is identical to the main voltage sweeper 32 of FIG. 4, but a sweep control signal input terminal corresponding to the terminal 41 of FIG. 4 is connected to the switching circuit 13 so as to receive the sweep control signal. The output of the main voltage sweeper is supplied to the local oscillator 4.

During the sequence of stepwise and alternate sweep of local oscillator 2 and local oscillator 4 until reaching a broadcast signal present in a channel, auxiliary voltage sweeper 43 receives the control signal from the switching circuit 13 at its terminal 49, and the voltage detector 51 of the voltage sweep circuit 3 receive the control signal from the switching circuit 13 through the clamping circuit 1′ at its terminal 56, so as to stop their functions, namely the functions of a sweeping increase of the auxiliary voltage and detection of excess voltage of the auxiliary voltage sweeper, respectively.

When, at the time *t*2, the sweep reaches the proper frequency required for tuning in a desired signal of a selected channel, the apparatus tunes-in the broadcast signal and, at this time, the mixer 6 is switched by an output of the switching circuit 13 so as to mix the HF signal with the output signal of the first local oscillator 2 and to deliver the IF signal to the IF amplifier 7. From that time, the aforementioned functions of the auxiliary voltage sweeper 43 and the voltage detector 51, which have been suspended during the sequence of stepwise and alternate sweeping of the local oscillators 2 and 4 are restored. Then, from the time *t*2 to the time *t*3 of FIG. 5, the oscillation frequency of the local oscillator 2 is maintained constant, as shown by the segment *e*3–*e*6 of FIG. 5 (3) by the afore-mentioned automatic control.

In one practical example of a TV receiver embodying the present invention, the first basic preliminary frequency *f* (*s*1) for each preliminary frequency for each channel is preferably selected to be lower than each proper frequency for each channel by a frequency difference less than 1.5 mega-Hz. In addition, the range of the frequence sweep of the first local oscillator 2 according to the voltage sweep of the auxiliary voltage sweeper 43 (hereafter referred to as "auxiliary sweep") is preferably set less than 3 mega-Hz. By the above-mentioned settings, a wrong automatic tuning by this apparatus in the sound carrier, whose frequency is higher by 4.5 mega-Hz than the video carrier of the channel, can be avoided.

Figure 6:
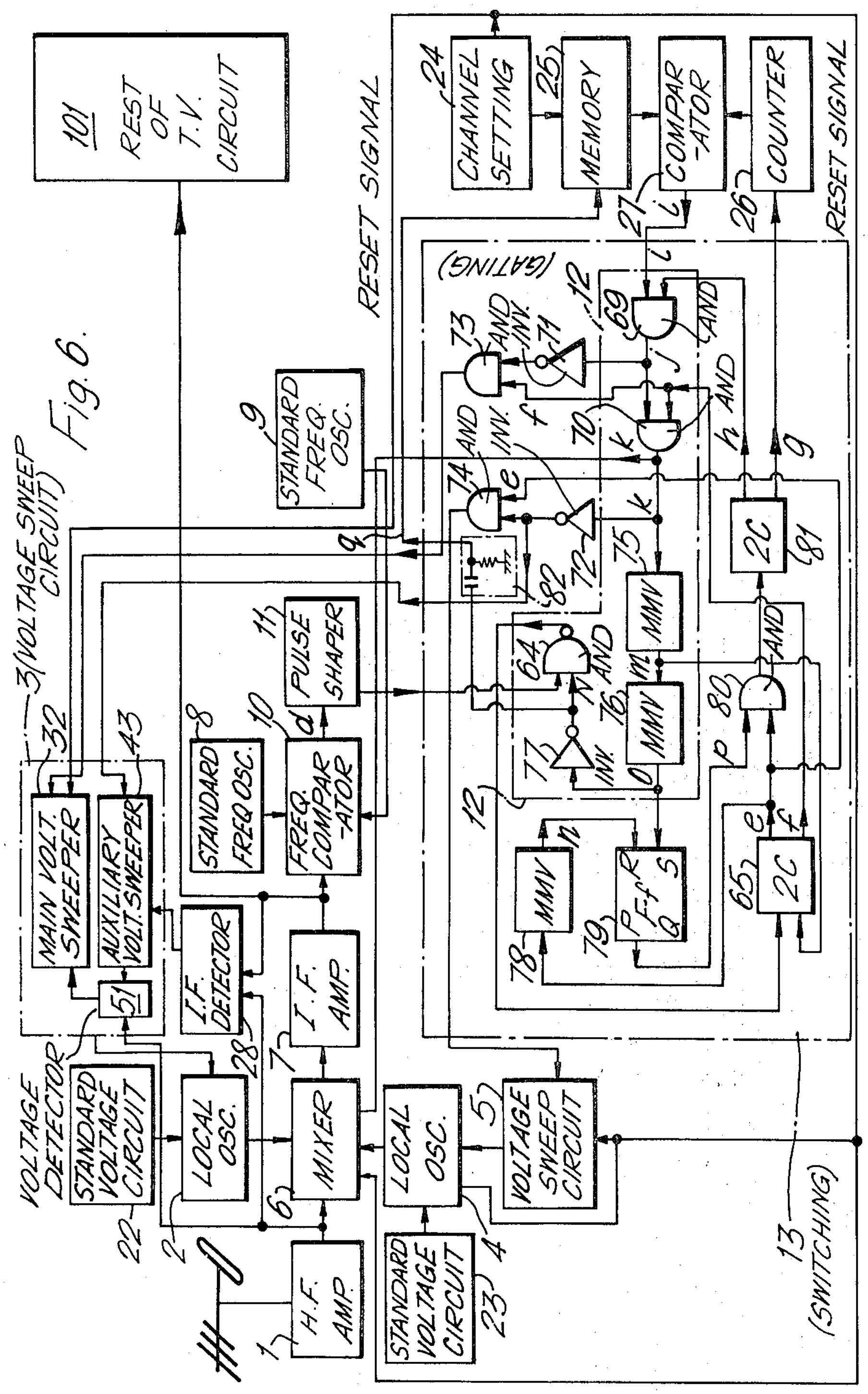
FIG. 6 is a more detailed block diagram illustrating the constitution of the apparatus.
Figure 7:
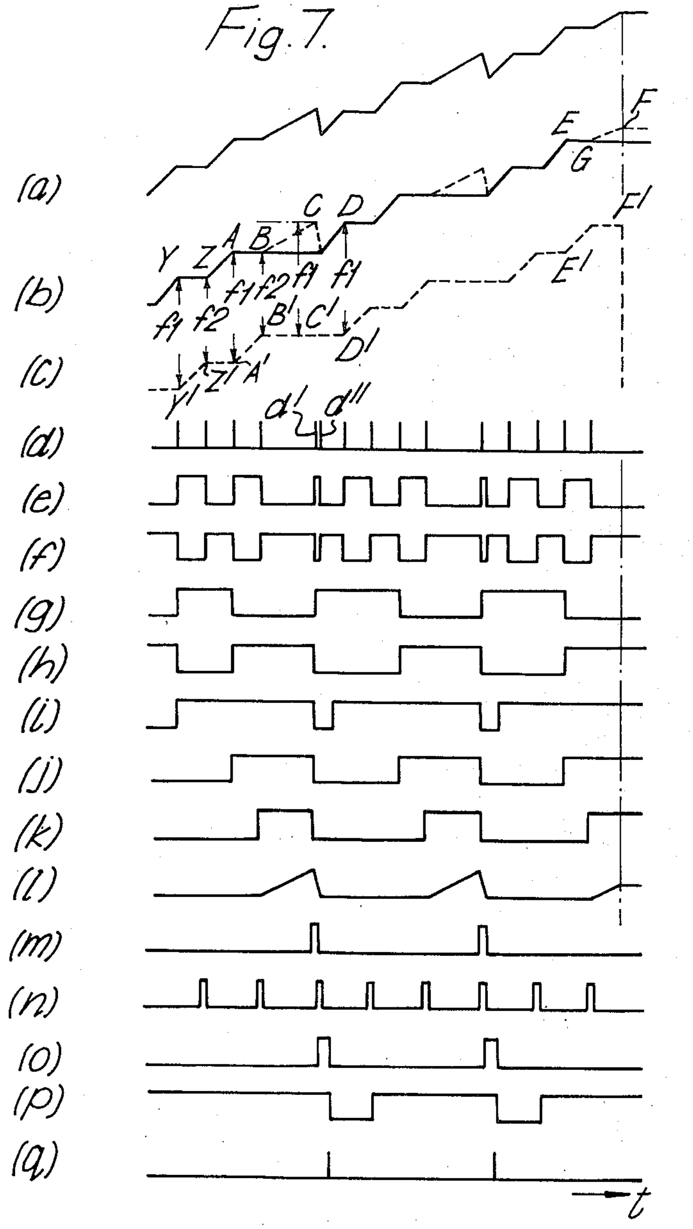
FIG. 7 is a time chart showing frequency curves (*a*) to (*c*) and (*l*), and voltage curves (*d*) to (*k*) and (*m*) to (*q*).

Next, referring to FIG. 6 and FIG. 7, together, explanation is made of an example of the automatic tuning apparatus of the present invention which comprises means for controlling the extent or range of the auxiliary sweep. In this example the auxiliary sweeping range is set less than 3 mega-Hz.

FIG. 6 shows a block diagram showing an overall constitution of the apparatus, as well as more detailed constitution of the switching circuit 13. FIG. 7 shows time charts of the frequencies and voltages of the various parts of the apparatus of FIG. 6.

In FIG. 7, curve (*a*) shows an actual oscillation frequency of the first local oscillator 2,

- curve (*l*) shows the frequency of the "auxiliary sweep",
- curve (*b*) shows a curve of the frequency of the first local oscillator 2 from which frequency the frequency of the foregoing auxiliary sweeping has been obtained. Curve (*b*) added with curve (*l*) forms curve (*a*),
- curve (*c*) shows an actual oscillation frequency of the second local oscillator 4, and
- curves (*d*) to (*k*) inclusive and the curves (*m*) to (*q*) inclusive show voltage forms of the various outputs indicated on connection lines in FIG. 6 with these marks "*d*" to "*k*" and "*m*" to "*q*", respectively.

The voltage sweep circuit 3 and the voltage sweep circuit 5 alternately and stepwise sweep upward from the lowest channel to the channel selected by the channel setting circuit 24. After the frequency of the first local oscillator reaches the preliminary frequency of the selected channel, the auxiliary voltage sweeper 43 begins to participate in the step-wise sweeping. When no signal is present in the selected channel, the alternate and step-wise sweep of the voltage sweep circuits 3 and 5 continues towards upper channels, leaving the selected channel and seeks the nearest broadcast signal in the next channel. Then the sweep stops when the sweep of the first voltage sweep circuit 3 reaches the preliminary frequency of the nearest channel in which the broadcast signal is present.

In FIGS. 7 (*b*) and (*c*) the point C indicates the point at which the proper frequency of the first local oscillator 2 is reached and the point C′ indicates the oscillation frequency of the second local oscillator 4, respectively, of a channel which is selected by the channel setting. The points A and A′ respectively indicate the frequencies of the first and the second local oscillator 2 and 4, respectively, when the sweep of the first local oscillator 2 reaches the preliminary frequency for the proper frequency at the point C. The point Y indicates a midway alternating point of the first local oscillation where the first local oscillator 2 reaches a mid-frequency, which is set at the center of the frequencies of two neighboring preliminary frequencies of two neighboring channels, respectively. The point Y′ is a midway alternating point of the second local oscillation.

As has been described in connection with FIG. 3, the first and the second oscillator 2 and 4 alternately and stepwise sweep upwards, and then, after a sequence of the alternate and stepwise sweeping of the oscillators 2 and 4, the frequency of the first local oscillator reaches the points Y and Y′ of FIG. 7 (*b*), (*c*).

Until the time when the frequencies of the first and the second local oscillators 2 and 4 reach the points Y and Y′, respectively, the number of the counter 26 is not coincident with the number of the memory 25. Accordingly, the comparator 27 does not provide an output of an agreeing signal "*i*" and, hence, AND-gates 69 and 70 do not produce outputs "*j*" and "*k*", respectively. Accordingly, the inverters 71 and 72 produce signals, thereby causing the outputs "*e*" and "*f*" of a binary counter 65 consisting of a flip-flop circuit, to pass through AND gates 73 and 74 and to reach the input terminal 41 of the main voltage sweeper 32 and the input terminal of the second voltage sweep circuit 5, respectively. Also, since the AND-gate 70 does not produce an output, mono-stable multivibrators (hereinafter referred to as "MMV"s) 75 and 76 do not produce output signals. Therefore, the inverter 77 delivers an output to the NAND-gate 64. Then, the NAND-gate 64 passes the output of the pulse shaper 11 to the binary counter circuit 65, causing the flip-flop circuit 65 to produce a "set" signal "*f*". This "set" signal "*f*" is transmitted through the AND-gate 73 to the main voltage sweep circuit 3 and through the AND-gate 70 and the AND-gate 74 to the second voltage sweep circuit 5, respectively, so that the step-wise and alternate sweep is completed.

At this moment, MMV 78 receives the output "*e*" of the binary counter 65 and delivers an output "*n*" to the reset input terminal of a flip-flop circuit 79 so as to reset it. Upon being reset, the flip-flop 79 supplies output signal "*p*" to the AND-gate 80 and, therefore, the output "*e*" of the binary counter 65 passes through the AND-gate 80 and reaches binary counter 81, which consists of a flip-flop circuit and divides the frequency of the output "*e*" of the binary counter 65 by two. The frequency-divided output "*h*" of the counter 81 is delivered to the AND-gate 69, and the other output "*g*" of the binary counter 81 is delivered to the counter 26.

With the above-mentioned constitution and operation, for every four output pulses of the frequency comparator 10, the binary counter 65 produces two pulses at output "*e*" and two pulses at output "*f*". Accordingly, the second binary counter 81 produces one pulse at output "h" and one pulse at output "*g*". Thus, the counter 26 receives one input signal "*g*" for every four outputs of frequency comparator 10.

On the other hand, comparator 10 produces four pulses while the first local oscillator 2 sweeps from a preliminary frequency to the next preliminary frequency. Namely, the comparator 10 produces the pulses when 1. the "frequency difference" between two local oscillators 2 and 4 becomes f1 at the time Y, Y' of FIG. 7 (*b*) (*c*),
2. the "frequency difference" becomes *f*2 at the time Z, Z',
3. the "frequency difference" becomes *f*1 at the time A, A', and
4. the "frequency difference" becomes *f*2 at the time B, B'.

Incidentally, *f*1 and *f*2 are selected to be about 58 and 55 mega-Hz, respectively, in this example.

Thus, the counter 26 receives one output "*g*" while local oscillators 2 and 4 sweep from one channel to the next channel. Accordingly, by setting the counter so as to have a specified number of the lowest channel at first, it is possible to control the number in the counter 26 to be equivalent to the channel number in which the first local oscillator 2 is tuning.

By constructing the counter 26 as discussed above, upon reaching the point Y, Y' in FIG. 7 (*b*) (*c*) of the sweep, the number in the counter 26 is increased by one receiving the signal "*g*" from the binary counter 81, and the number agrees with the number in the memory circuit 25. Accordingly, the comparator 27 provides an output "*i*" to the AND-gate 69. However, at this time, the output "*h*" of the binary counter 81 is "0" and, accordingly, AND-gate 69 supplies no output "*j*" making the outputs of the inverters 71 and 72 "1". (Herein, "0" and "1" are used to represent "Low" and "High" output voltages, respectively.)

Then, at the time Z,Z' of the sweep, the frequency comparator 10 supplies the next signal "*d*" through the pulse shaper 11 and the normally open NAND-gate 64 to the binary counter 65. Accordingly, the binary counter 65 is inverted, so that output "*e*" becomes "*O*" and the output "*f*" becomes "1" after time Z, Z'.

Receiving the output "*f*" and the output of the inverter 71, AND-gate 73 supplies an output to the terminal 41 of the main-voltage sweeper 32 and causes the first local oscillator 2 to start the main sweep. Simultaneously, since the signal "*e*" of the binary counter 65 has become "0", the AND-gate 74 cuts off its output to the second voltage sweep circuit 5 and causes the second local frequency oscillator 4 to stop its sweep.

When the sweep reaches the point A, A', the frequency comparator 10 delivers a signal "*d*" and, as in the afore-mentioned step, the binary counter 65 is inverted to change the outputs "*e*" and "*f*" to "1" and "0", respectively. Upon receiving the signal "*e*" from the counter 65 and a signal "*p*" from the flip-flop circuit 79, the AND-gate 80 delivers the output signal to the binary counter 81. Accordingly, the AND-gate 69 receives the signal "*h*" from the counter 81 and supplies output "*j*" to the inverter 71 so as to terminate its output. Accordingly, the AND-gate 73 stops supplying its output to the main voltage sweeper 32, so as to terminate the main sweep.

At the same time, namely after A, A', since the output "*e*" of the binary counter 65 is "1" and is delivered to the AND-gate 74, which is opened by a signal from the inverter 72, the AND-gate 74 delivers its output to the second voltage sweep circuit 5 which starts to sweep, so that the frequency of the second local oscillator 4 increases to the extent of a specified range less than 3 mega-Hz, and the sweep reaches the points B, B' in FIG. 7. Upon reaching B, B', the frequency comparator 10 delivers the next signal to the NAND-gate 64, through the pulse shaper 11, and at this moment, the binary counter 65 produces a signal. Therefore, like the above-mentioned step, the second voltage sweep circuit 5 stops its sweep, stopping the sweep of the second local oscillator 4. Since the signal "*j*" is supplied from the and gate 69 to the inverter, the output of the inverter 71 is "0" and, accordingly the AND-gate 73 is closed, so that its output to the main voltage sweeper 32 is terminated to maintain cessation of the main sweep. At the moment B, B' upon receiving the signal "*f*", the AND-gate 70 delivers an output signal "*k*" to the inverter 72. Accordingly, the inverter 72 delivers a "0" signal to the terminal 49 of the auxiliary voltage sweeper 43, so as to start the auxiliary sweep at B, B'. Since the auxiliary sweeping is as shown by the curve "*l*" of FIG. 7, the actual oscillation frequency of the first local oscillator 2 becomes curve "*a*" of FIG. 7.

The frequency of the local oscillation of the first local oscillator 2, at the time A, where the main frequency sweep is caused by the voltage sweep of the main voltage sweeper 32, is set to be the preliminary frequency of the channel. Also, this frequency is set to be lower than the proper frequency of the first local oscillator 2 for that channel, by less than 1.5 mega-Hz. By such a setting, if any broadcast signal is present in the selected channel, when the auxiliary sweep is started, the mixer 6 is switched, so as not to receive output signal to the HF amplifiier 1, from the output signal "k" of the AND circuit 70. Accordingly, the IF detector 28 does not receive any signal and, therefore, no feedback signal is supplied to the feedback signal input terminal 50 of the auxiliary voltage sweeper 43. Accordingly, the auxiliary sweeping shown by the curve (1) of FIG. 7 continues.

At the time C, C′ of FIG. 7 (b) (c), when the auxiliary sweeping of a range less than 3 mega-HZ has been completed and the "frequency difference" between the oscillation frequencies of the first and the second local oscillators 2 and 4 again become f1, the frequency comparator 10 delivers the next output d′ as shown in FIG. 7 (d). This output d′ causes inversion of the outputs "e" and "f" of the binary counter 65 and, then an increase of the output "e" causes an inversion of the outputs "g" and "h" of the binary counter 81, so that the output "g" becomes "1" and the output "h" becomes "0".

Since the output "h" becomes "0", the output signal "j" of the AND-gate 69 becomes "0" and, hence, the output "k" of the AND-gate 70 becomes "0", causing the inverter 72 to deliver an output to the input terminal 49 of the auxiliary voltage sweeper 43. Therefore, by receiving a reset signal from the inverter 72 at its terminal 49, the auxiliary voltage sweeper 43 is reset at the time C, C′ and stops the auxiliary sweep as shown by curve "l" of FIG. 7.

Simultaneously, namely at the time C, C′, since the output of the inverter 72 is provided as aforementioned, the AND gate 74 passes the "1" output "e" of the binary counter 65 to the second voltage sweep circuit 5. Accordingly, the second voltage sweep circuit 5 starts to sweep from the time C, C′. Also, from the time C, C′, the output "f" of the binary counter 65 becomes "0" and, consequently, the output "0" of the AND-gate 73 becomes "0" although the output of the inverter 71 becomes "1" at the time C, C′. Accordingly, the main voltage sweeper 32 continues not to sweep.

However, immediately after the time C, C′, the above-mentioned continued sweep of the main voltage sweeper 32 and the starting of the second voltage sweep circuit 5 are interrupted and inverted immediately after the time C, C′, as follows, in order to prevent the frequency difference between the first and the second local oscillations from becoming less than the specified frequency "f2" (namely 55 mega-Hz).

The above-mentioned inversion of the cessation and sweep of the circuits 32 and 5 occurs as follows. A mono-stable multivibrator (MMV) 75, for generating very short pulses, is triggered by the rising edge of the output pulse "k" of AND-gate 70 and the output "m" of MMV75 is supplied to the binary counter 65. Accordingly the trailing edge of the output "m" of MMV 75 triggers and inverts the output of the counter 65, so as to change the output "e" to "1", and the output "f" to "0", respectively. By setting the pulse width of the output "m" of MMV 75 to be very narrow, the inversion can be made immediately after the time C, C′, and accordingly, it can be practically considered that the main voltage sweeper 32 starts sweeping and the second voltage sweep circuit 5 stops sweeping, respectively, substantially at the time C, C′.

The output "m" of MMV75 is delivered to a second MMV76, so as to trigger MMV76 by the trailing edge of the MMV75. Output "0" of MMV76 is delivered to an inverter 77, whose output is delivered to the NAND-gate 64. Accordingly, after time C, C′, transmission of the output of the frequency comparator 10 through the pulse shaper 11 to the binary counter 65 is prevented by the NAND circuit 64. Accordingly, the NAND-gate 64 prevents transmission of the undesirable pulse from the frequency comparator 10 to the binary counter 65, which pulse is indicated as d″ in FIG. 7 (d) and is generated by the frequency comparator 10 when the "frequency difference" between the frequencies of the first and the second local oscillators 2 and 4 becomes f2 (which is 55 mega-Hz) during a rapid decrease of the auxiliary sweep shown by the dotted line in FIG. 7 (l).

Since the number in the counter 25 has been increased by 1, the contents of the counter do not coincide with the number in the memory circuit 25. Such a lack of coincidence is corrected by delivered the output "0" of the MMV 76 to the inverter 77, supplying the output of the inverter 77 to a differentiator 82 and then delivering the differentiated output "q" to the memory circuit 25, so as to increase its number by 1. Thus, the numbers in the memory 25 and the counter 26 agree with each other, and as a result the comparator 27 provides an output "i", so that the apparatus can accept another number setting at the channel setting means 24.

After a further sweep of the second local oscillator 4, the sweep reaches the points D, D′ of FIG. 7 (b) and (c). During this sweep the flip-flop circuit 79 is set by the trailing edge of the output signal "0" of MMV76, and the flip-flop circuit 79 is "reset" by the trailing edge of the output "n" of MMV 78, and the output "p" of the flip-flop circuit 79 is delivered to AND-gate 80, so that output "e" of the binary counter 65 is prevented from undesirable transmission to the flip-flop 81 during absence of the output "p" of the flip-flop 79. For such a preventive measure, the apparatus would undesirsbly reach a state similar to those at the time A, A′, since the comparator 27 generates a signal "i" at the generation of the output "d" of the frequency comparator 10 and causes the apparatus to erroneously repeat the procedures subsequent to the time A, A′. On account of the afore-mentioned preventive measures, the entire apparatus reaches a state D, D′ shown in FIG. 7 (b), (c), which state corresponds to midway alternating point Y, Y′.

As described above, the apparatus sweeps from the time Y, Y′ to the time D, D′, when no broadcast signal is present in the channel. If no broadcast signal is present in the next channel, another sweep is repeated in a similar way. Thus, sweep after sweep of the apparatus is carried out until a broadcast signal is found in a channel and until the IF detector 28 makes a signal and stops the sweep.

When, at the time E, E′, the sweep of the first local oscillator 2 reaches a preliminary frequency of a channel wherein a broadcast signal is present, the IF detector 28 detects the IF signal during the auxiliary sweep indicated by the dotted line G—F and, hence, the IF detector 28 delivers an output to the feedback control signal input terminal 50 of the auxiliary sweeper 43. Accordingly, the auxiliary voltage sweeper 43 stops at the proper voltage where oscillation occurs at the proper first local oscillation frequency at F. Thereafter, the main voltage sweeper 32 and the auxiliary voltage sweeper 43 cooperatively operate so as to maintain the proper frequency as illustrated in FIGS. 4 and 5, and ensures stable tuning of the broadcast signal. Since the auxiliary frequency sweep shown by FIG. 7 (*l*) is stopped at the instant of tuning as above-mentioned, the frequency comparator 10 no longer delivers an output during the tuned receiving period and all the sweep cease. Accordingly, the second local oscillator 4 stops oscillating and, with this, the entire foregoing process of the automatic tuning is complete.

The apparatus of the present invention, according to the above-mentioned description, has the following advantages and features:

1. By setting the frequency range of sweep to be 3 mega-Hz for receiving a television broadcast signal in a TV signal band having TV signals with a 6 mega-Hz interval, wherein carrier frequencies of the video signal and the audio signal are separated by 4.5 mega-Hz, the apparatus is free from undesirable erroneous tuning in an audio signal carrier by the automatic tuner for the video signal.

2. In this apparatus, the frequency range over which the auxiliary sweep has been made in the first frequency sweeping means (2 + 3) is detected by stopping the sweep of the second local oscillator 4 in the second frequency sweeping means (4 + 5) and by comparing the oscillation frequency of the second local oscillator 4 upon cessation with the oscillation frequency of the first frequency sweeping means (2 + 3) with the use of frequency comparator 10. The output of the comparator 10 is used to control the sweep of the local oscillators. Therefore, in the apparatus of the present invention, the local oscillation frequency (of 2), which is cused in the mixer 6, is controlled by the feedback system, i.e., by an automatic control system, which comprises the standard frequency oscillator 9, frequency comparator 10, gating circuit 12 and the switching circuit 13. Accordingly, the apparatus of the present invention is very precise in controlling the frequency, compared with the conventional apparatus wherein the frequency sweep oscillator is controlled by directly controlling the voltage applied to a varactor without such use of the feedback system as used in the present invention.

The present invention is very useful for tuners in VHF and UHF frequency bands, wherein the frequency sweep ranges which correspond to voltage sweep ranges considerably disagree, when the upper part is compared against the lower part of the band and, hence, a precise and smooth control of the frequency, by directly controlling (without feedback system) the voltage, is very difficult.

3. Since the apparatus is controlled by the output of the frequency comparator 10 so as to stop its main sweep and to hold the proper frequency, undesirable detuning or erroneous operation is prevented.

4. In the first voltage sweep circuit 3, the main voltage sweeper 32 holds the voltage steady for a long time without prominent decrease and a slight decrease of the voltage due to inevitable leakage is compensated by an automatically controlled increase of the voltage of the auxiliary voltage sweeper 43 and, therefore, the frequency of the first local oscillator 2, to which the output of the first voltage sweep circuit 3 is supplied, is maintained exactly constant for a long time during the tuned-in state for receiving a selected television broadcast signal.

5. In the automatic tuning apparatus of the present invention, the output voltage of the first voltage sweep circuit 3, which supplies voltage to the first local oscillator 2, is effected by superimposing the divided voltage of the output of the auxiliary voltage sweeper 43 on the output voltage of the main voltage sweeper 32. Moreover, the apparatus is so constituted that only the output of the auxiliary voltage sweeper 43 is influenced by an interruption of the broadcast signal, while the voltage of the main voltage sweeper 32 is maintained constant.

Accordingly, the tuning to the broadcast signal is not lost even during an interruption of the broadcast signal, and the output of the auxiliary voltage sweeper 43 is again well controlled by restoring the automatic control and supplies a proper voltage to the first local oscillator 2 when the broadcast signal is present again.

6. Since the first local oscillator 2 and the second local oscillator 4 alternately and step-wise sweep to increase their oscillation frequency by the extent of a preset frequency difference and the switching circuit 13 delivers output signals to the counter 26 at the times of alternation of the oscillations of the two local oscillators 2 and 4, it is possible to count and digitally indicate the number of the channel tuned in, by counting the output of the switching circuit 13.

7. The selection of the channel is effected by operating channel setting means 24 which supplies its digital output to the memory circuit 25. Upon the setting operation, the frequency sweeping means (2 + 3) and (4+5) are reset at their lowest preliminary frequencies $f(s1)$ and $f\ (s2)$, respectively, and alternately sweep until the frequency of the first local oscillator 2 tunes in the broadcast signal of the selected channel. If a broadcast signal is not present in this selected channel, the frequency sweeping means continue the alternate and step-wise sweep while increasing the contents of the counter 26, until the nearest channel in which a broadcast signal is present is reached. When at this nearest channel, the first local oscillator 2 stops its sweep at the proper frequency for receiving the signal.

Accordingly, a channel selection by a certain electric remote control means can be easily realized and furthermore, a search for the presence of a broadcast signal can be easily carried out.

This invention being thus described, it will be obvious that the same may be varied in many ways. Such variations are not to be regarded as a departure from the spirit and scope of the invention and all such modifications are intended to be included with the scope of the following claims.

I claim:

1. In an automatic tuning apparatus having a tuning circuit for combining a received high-frequency input signal with a local oscillator signal to extract a broadcast signal therefrom, the improvement comprising:

frequency sweeping means for sweeping the frequency of said local oscillator signal from a starting frequency, of a channel which contains the frequency of a broadcast signal to be tuned in, said starting frequency being close to an upper or lower end of the range of said channel, through said broadcast signal to be tuned in, over a specified frequency width which is no broader than the frequency range of said channel; and control means, coupled to said frequency sweeping means and responsive to the output of said tuning circuit, for terminating the frequency sweeping by said sweeping means in two instances, (a) upon said tuning circuit tuning in a broadcast signal, and (b) upon said tuning circuit having failed to tune in a broadcast signal when the range of said sweeping has reached a specified frequency range.

2. An automatic tuning apparatus according to claim 1, wherein said tuning circuit is one capable of tuning in a video signal and an audio signal and the range of said frequency sweep is less than the difference between the frequency of a video signal carrier and the frequency of its audio signal carrier.

3. The improvement according to claim 1, wherein said frequency sweeping means includes first means for sweeping a first local oscillator signal in a stepwise manner consisting of a sweep and pause operation, from a first starting frequency; and second means for sweeping a second local oscillator signal in a stepwise manner consisting of a pause and sweep operation in coincidence with the sweep and pause operation of said means for sweeping a first local oscillator signal, from a second starting frequency; and wherein said control means includes means for controlling said first and second means, so as to alternate the sweep and pause operations of said first and second means, upon detection that the frequency difference between said first and second means reaches a first preselected frequency, and to alternate the pause and sweep operations of said first and second means upon detection that the frequency difference between said first and second means reaches a second preselected frequency, and to stop the sweeping of both said first and second means upon the detection of the frequencies of said first and second means reaching respective preset frequencies, and auxiliary frequency sweep means, responsive to the cessation of sweeping by said first and second means, for causing said first means to effect an auxiliary sweep beyond the proper frequency for tuning in a signal over a present auxiliary range which is narrower than the width of the frequency range of a channel containing a broadcast signal to be tuned in, and for causing said first means to stop its auxiliary sweep upon the completion of the sweep over said preset auxiliary range or upon the output of said tuning circuit being a broadcast signal.

4. The improvement according to claim 3, wherein said control means includes means, in response to the stop of a sweep by said first means, for causing said second means to sweep said second local oscillator signal over an extent corresponding to said frequency difference and to then stop.

5. An automatic tuning apparatus according to claim 3, further comprising a frequency comparator, coupled to said auxiliary frequency sweep means, for stopping said auxiliary sweep in response to a comparison of the frequencies swept during said auxiliary sweep and the frequency of said second means.

6. An automatic tuning apparatus according to claim 3, further including a frequency comparator, coupled to said control means and said auxiliary frequency sweep means, for controlling the alternate sweeps and stoppage of said first and second means and the stoppage of said auxiliary sweep.

7. An automatic tuning apparatus according to claim 3, further comprising:

a counter, responsive to the outputs of said first and second means, for counting the number of alternate stops and sweeps of said first and second means;

a memory circuit for storing the number of a selected channel within which a frequency to be swept exists; and a comparator, coupled to said counter and said memory circuit, for detecting the completion of a necessary number of sweeps by comparing the number stored in said counter with the contents of said memory, and upon coincidence of said stored number and said contents, for stopping said alternate sweeps.

8. An automatic tuning apparatus according to claim 7, further including a frequency comparator, responsive to the extent of said auxiliary sweep, for controlling the stopping of said auxiliary sweep and for causing the generation of a signal to increase the contents of said memory by one.

9. An automatic tuning apparatus according to claim 3, wherein the frequency difference between an adjacent stop of the sweep of one of said first and second frequency sweeps is $1/n$ of the frequency difference between adjacent channels in which swept frequencies lie, n being an integer.

10. An automatic tuning apparatus according to claim 3, wherein said first and second means commense their respective sweeps at said first and second starting frequencies, respectively.

11. An automatic tuning apparatus according to claim 10, wherein said first starting frequency is lower than the tuning-in frequency of the lowest channel within which frequencies to be swept lie by a specified frequency difference.

12. An automatic tuning apparatus according to claim 3, wherein said first means includes a first resonant circuit comprising a first varactor as the resonance element coupled to a first voltage sweep circuit which includes a main voltage sweep circuit and an auxiliary voltage sweep circuit, the output voltages of said first and main voltage sweep circuits superimposed on each other and supplied to said first varactor, and wherein said second means comprises an second resonant circuit including a second varactor as the resonance element coupled to a second voltage sweep circuit, the output of which is applied to said second varactor.

13. An automatic tuning apparatus according to claim 12, wherein said main voltage sweep circuit is capable of maintaining its output voltage with very little decrease during the stoppage of its sweep, said auxiliary voltage sweep circuit generates an increasing sweep voltage to compensate the decrease in the voltage of said main sweep circuit, and further including a voltage superimposing means for combining the outputs of said main voltage sweep circuit and said auxiliary voltage sweep circuit according to a specified proportion.

14. An automatic tuning apparatus according to claim 3, further comprising means, coupled to said first means, for stopping said auxiliary sweep when a swept frequency corresponds to a broadcast signal.

15. An automatic tuning apparatus, for tuning a receiver to a broadcast frequency included among a channel of frequencies, having at least a tuning circuit for input high-frequency signals and a local oscillator circuit, the apparatus comprising:

first means for receiving a signal within which a broadcast signal may be included;

second means, coupled to said first means, for combining said signal with at least one swept oscillation frequency signal;

third means, coupled to said second means, for sweeping said at least one swept oscillation frequency, from a starting frequency of a channel which contains a frequency of a broadcast signal to be tuned-in, which starting frequency is set close to an upper or lower end of the range of said channel, and sweeps through said broadcast signal to be tuned-in, and sweeps by an extent of a specified frequency width of the frequency range of said channel, and, fourth means, coupled to said third means, for terminating the sweep of said third means in two instances, (a) upon said tuning circuit tuning in a broadcast signal, and (b) upon said tuning circuit having failed to tune in a broadcast signal when the range of said sweeping has reached a specified frequency range.

16. An automatic tuning apparatus according to claim 15, wherein said third means comprises a first frequency sweep oscillator for sweeping a first oscillation frequency signal starting from a first initial frequency, said initial frequency being separated from a tuned-in broadcast frequency by a predetermined frequency spacing.

17. An automatic tuning apparatus according to claim 16, wherein said third means further comprises a second frequency sweep oscillator for sweeping a second oscillation frequency signal starting from a second initial frequency, the outputs of said first and second frequency sweep oscillators being applied to said second means, and said fourth means includes means for alternately starting and stopping said first and second frequency sweep oscillators in response to the oscillation frequency outputs thereof corresponding to prescribed frequency differences.

18. An automatic tuning apparatus according to claim 17, wherein said prescribed frequency differences comprise first and second discrete frequency differences.

19. An automatic tuning apparatus according to claim 16, wherein said first frequency sweep oscillator comprises a first voltage controlled local oscillator circuit coupled to a first standard voltage circuit for establishing said first initial frequency and a first voltage sweep circuit for supplying a first sweep voltage to said first local oscillator circuit to control the oscillation frequency sweep output thereof.

20. An automatic tuning apparatus according to claim 19, wherein said first voltage sweep circuit comprises a main voltage sweep circuit and an auxiliary voltage sweep circuit, the sweep control of which being responsive to the output of said fourth means, and means for combining the voltage output of said main an auxiliary voltage sweep circuits and for supplying said combined voltage outputs to said first local oscillator circuit.

21. An automatic tuning apparatus according to claim 17, wherein said first frequency sweep oscillator comprises a first voltage controlled local oscillator circuit coupled to a first standard voltage circuit for establishing said first initial frequency and a first voltage sweep circuit for supplying a first sweep voltage to said first local oscillator circuit to control the oscillation frequency sweep output thereof.

22. An automatic tuning apparatus according to claim 21, wherein said first voltage sweep circuit comprises a main voltage sweep circuit and an auxiliary voltage sweep circuit, the sweep control of which being responsive to the output of said fourth means, and means for combining the voltage outputs of said main an auxiliary voltage sweep circuits and for supplying said combined voltage outputs to said first local oscillator circuit.

23. An automatic tuning apparatus according to claim 22, wherein said second frequency sweep oscillator comprises a second voltage controlled local oscillator circuit coupled to a second standard voltage circuit for establishing said second initial frequency and a second voltage sweep circuit for supplying a second sweep voltage to said second local oscillator circuit to control the oscillation frequency sweep output thereof.

24. An automatic tuning apparatus according to claim 17, wherein said fourth means includes a frequency comparator, responsive to the output of said second means for generating alternate stop and start sweep signals upon the output of said second means reaching said prescribed frequency differences.

25. An automatic tuning apparatus according to claim 23, wherein said fourth means includes a frequency comparator, responsive to the output of said second means for generating alternate stop and start sweep signals upon the output of said second means reaching said prescribed frequency differences.

26. An automatic tuning apparatus according to claim 17, wherein said fourth means further includes means for causing said first frequency sweep oscillator to carry out an auxiliary frequency sweep subsequent to the end of a prescribed number of sweeps of said first and second frequency sweep oscillators.

27. An automatic tuning apparatus according to claim 25, wherein said fourth means further includes means for causing said auxiliary voltage sweep circuit to supply an auxiliary voltage sweep output to said first local oscillator circuit upon completion of a prescribed frequency range sweep by said first and second frequency sweep oscillators.

28. An automatic tuning apparatus according to claim 25, wherein said fourth means further includes means for causing said auxiliary voltage sweep circuit to supply an auxiliary voltage sweep output to said first local oscillator circuit upon completion of a prescribed number of alternate sweep stops and starts by said first and second frequency sweep oscillators.

29. An automatic tuning apparatus according to claim 17, wherein said fourth means further includes means for causing said first frequency sweep oscillator to carry out an auxiliary frequency sweep upon the end of the alternate sweeps of said first and second frequency sweep oscillators over a prescribed frequency range.

30. An automatic tuning apparatus according to claim 29, wherein said fourth means further includes a counter, responsive to the number of alternate sweeps by said first and second frequency oscillators, for counting said number of alternate sweeps, a memory circuit for storing the number of a selected channel, and a comparator circuit, coupled to said counter and said memory circuit, for detecting the completion of a prescribed number of sweeps and for stopping said alternate sweeps upon coincidence of the contents of said counter and said memory circuit.

31. An automatic tuning apparatus according to claim 28, wherein said fourth means further includes a counter, responsive to the number of alternate sweeps by said first and second frequency oscillators, for counting said number of alternate sweeps, a memory circuit for storing the number of a selected channel, and a comparator circuit, coupled to said counter and said memory circuit, for detecting the completion of a prescribed number of sweeps and for stopping said alternate sweeps upon coincidence of the contents of said counter and said memory circuit.

32. An automatic tuning apparatus according to claim 30, wherein said fourth means further includes a switching circuit and a gating circuit, said gating circuit being coupled to the output of said frequency comparator and said comparator circuit for gating the output thereof to said switching circuit in the absence of a number contents coincidence input to said comparator circuit, said switching circuit controlling the alternate stopping and starting of the sweeps of said first and second frequency sweep oscillators and the contents of said counter.

33. An automatic tuning apparatus according to claim 31, wherein said fourth means further includes a switching circuit and a gating circuit, said gating circuit being coupled to the output of said frequency comparator and said comparator circuit for gating the output thereof to said switching circuit in the absence of a number contents coincidence input to said comparator circuit, said switching circuit controlling the alternate stopping and staring of the sweeps of said first and second frequency sweep oscillators and the contents of said counter.

34. An automatic tuning apparatus according to claim 33, wherein said gating circuit comprises first and second AND gates connected in series said first AND gate receiving the output of said comparator circuit and each of said AND gates receiving respective first and second outputs of said switching circuit, first and second monostable multivibrators connected in series to the output of said second AND gate, and an inverter and NAND gate connected to the output of said second monostable multivibrator, and the output of said frequency comparator, the outputs of said first and second AND gates being coupled through said switching circuit to said first and second frequency sweep oscillators, the output of said inverter being coupled to said memory circuit to increase the contents thereof, and the output of said monostable multivibrators being coupled to said switching circuit.

35. An automatic tuning apparatus according to claim 34, wherein said switching circuit comprises third and fourth AND gates coupled to the outputs of said first and second AND gates for gating sweep control signals to said first and second frequency sweep oscillators, first and second flip-flops gated in series through a fifth AND gate, and coupled to the outputs of said NAND gate and said monostable multivibrators for providing a count signal to said counter in response to the alternate sweeps of said frequency sweep oscillators, and a third flip-flop and monostable multivibrator connected in series, said third monostable multivibrator being connected to an output of said first flip-flop, said third flip-flop being connected to the outputs of said second and third monostable multivibrators and having its output gated through said fifth AND gate to said second flip-flop.

36. An automatic tuning apparatus according to claim 33, wherein said fourth means further includes a frequency detector circuit responsive to the outputs of said first and second means for terminating the sweep of said auxiliary voltage sweep circuit.

* * * * *